United States Patent
Welland

(10) Patent No.: US 9,634,824 B2
(45) Date of Patent: Apr. 25, 2017

(54) METHOD AND APPARATUS FOR PROVIDING A SYNTHETIC SYSTEM USING A GPS CLOCK

(71) Applicant: Robert Welland, Seattle, WA (US)

(72) Inventor: Robert Welland, Seattle, WA (US)

(*) Notice: Subject to any disclaimer, the term of this patent is extended or adjusted under 35 U.S.C. 154(b) by 8 days.

(21) Appl. No.: 14/693,750

(22) Filed: Apr. 22, 2015

(65) Prior Publication Data

US 2015/0229466 A1    Aug. 13, 2015

Related U.S. Application Data

(62) Division of application No. 14/144,153, filed on Dec. 30, 2013, now Pat. No. 9,031,062.

(51) Int. Cl.
*H04L 7/00* (2006.01)
*H04L 12/24* (2006.01)

(52) U.S. Cl.
CPC .............. *H04L 7/0008* (2013.01); *H04L 7/00* (2013.01); *H04L 7/0087* (2013.01); *H04L 41/0823* (2013.01)

(58) Field of Classification Search
None
See application file for complete search history.

(56) References Cited

U.S. PATENT DOCUMENTS

| | | | |
|---|---|---|---|
| 2004/0190378 A1* | 9/2004 | Farmer | H04W 56/0015 368/47 |
| 2009/0091495 A1* | 4/2009 | Meyers | G01S 19/23 342/357.48 |
| 2009/0174455 A1* | 7/2009 | Dimitriu | G06F 13/4072 327/295 |
| 2010/0008351 A1* | 1/2010 | Ashwood-Smith | H04J 3/0661 370/350 |
| 2011/0001567 A1* | 1/2011 | Nicholls | H03L 1/026 331/25 |
| 2011/0206053 A1* | 8/2011 | Henry | H04L 12/462 370/400 |

* cited by examiner

*Primary Examiner* — Hassan Phillips
*Assistant Examiner* — Duc Duong
(74) *Attorney, Agent, or Firm* — James M. Wu; JW Law Group

(57) ABSTRACT

A method and apparatus of providing a configurable computer system capable of being modeled are disclosed. The system, in one embodiment, includes a configurable component and a clock distributor. The configurable component includes multiple programmable devices arranged in a predefined configuration. The predefined configuration, for example, is a cubical shape having multiple neighboring nodes. The configurable component is capable of being modeled in accordance with policies from a system program for data transmission. The clock distributor further includes a first clock element, which provides long-term accuracy, and a second clock element, which provides short-term accuracy.

17 Claims, 14 Drawing Sheets

METHOD AND APPARATUS FOR PROVIDING A SYNTHETIC SYSTEM USING A GPS CLOCK

PRIORITY

This application is a divisional application of U.S. patent application Ser. No. 14/144,153, filed on Dec. 30, 2013 in the name of the same inventor, entitled "Method and Apparatus for Providing a Synthetic System," which is a divisional application of U.S. Pat. No. 8,644,438 with an application Ser. No. 13/016,954, filed on Jan. 28, 2011 in the name of the same inventor and entitled "Methods and Apparatus for Providing a Synthetic System," which further claims the benefit of priority based upon the U.S. Provisional Patent Application Ser. No. 61/299,971 filed on Jan. 30, 2010 in the name of the same inventor and entitled "Methods and Apparatus for Providing a Synthetic System," all of which are hereby incorporated herein by reference.

FIELD

The exemplary embodiment(s) of the present invention relates to the field of system communications. More specifically, the exemplary embodiment(s) of the present invention relates to configurable computing systems.

BACKGROUND

With increasing popularity of instant information exchange over one or more communications networks across multiple continents, a high-speed communications network is required to handle voluminous information, which may include voice, video, data, and/or a combination of voice, video, and data. A high-speed communications network typically includes network computing devices such as bridges, hubs, routers, and switches, for routing and directing large number of data packets or bit streams through network traffics between source nodes and destination nodes.

For instance, information pertaining to the transfer of packet(s) through the network is usually embedded within one or more packets. Each packet traveling through a network can typically be treated independently from other packets in a bit stream. Each router within a network processes incoming packets and determines where the packet(s) should be forwarded. In a high-speed computing network environment, the speed of packet processing or routing can be critical in determining the performance of overall network system.

To process a large amount of data through network traffics, a network processing server, which typically includes an array of computing and/or searching device, is used to handle the data in a timely manner. As the demand of data processing increases, additional computing power is needed. A problem associated with employing conventional computers or processing devices is that conventional computers or processing devices are inefficient in handling network data processing. For instance, an ordinary computer is built with a great deal of embedded system policies. For example, the policy may involve network routing algorithms, instruction sets, searching algorithms, running application programs, displaying videos, and so forth. Each of the policy elements makes the machine more rigid and less flexible. Although a conventional computer is capable of performing many tasks, it is inefficient to handle data processing over a communications network.

SUMMARY

A configurable computer system capable of being modeled by a program or a compiler is disclosed. The system, in one embodiment, includes a configurable component and a clock distributor. The configurable component includes multiple programmable devices arranged in a predefined configuration. The predefined configuration, for example, is a cubical shape having multiple neighboring nodes. The configurable component can be modeled in accordance with policies from a system program for data transmission. The clock distributor further includes a first clock, which provides long-term accuracy, and a second clock, which provides short-term accuracy. In one embodiment, the first clock is a global positioning system ("GPS") clock and the second clock is an atomic clock.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1A:
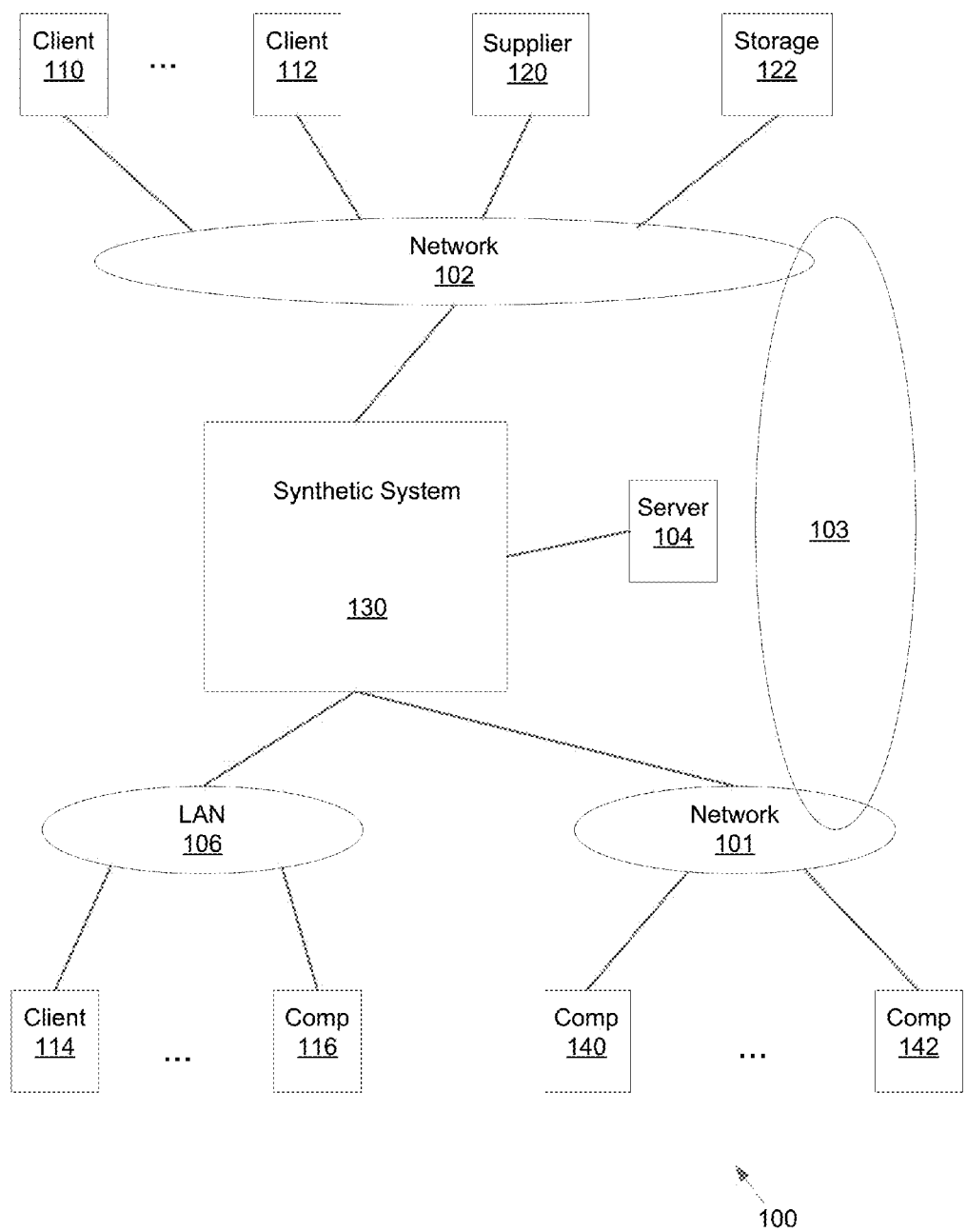
FIG. 1A is a computer network topology illustrating a network environment having a synthetic system in accordance with one embodiment of the present invention.

Embodiments of the present invention are described herein in the context of a method, system, and apparatus for modeling a configurable computer system.

Those of ordinary skills in the art will realize that the following detailed description of the exemplary embodiment(s) of present invention is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

In the interest of clarity, not all of the standard hardware and routine features of the implementations described herein are shown and described. It will, of course, be understood that in the development of any such actual implementation, numerous implementation-specific decisions can be made in order to achieve the developer's specific goals, such as compliance with application- and business-related constraints, and that these specific goals will vary from one implementation to another and from one developer to another. Moreover, it will be understood that such a development effort might be complex and time-consuming, but would nevertheless be a routine undertaking of engineering for those of ordinary skills in the art having the benefit of this disclosure.

In accordance with the exemplary embodiment(s) of the present invention, the components, process steps, and/or data structures described herein may be implemented using various types of operating systems, computing platforms, computer programs, and/or general purpose machines. In addition, those of ordinary skills in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

The exemplary embodiment(s) of the present invention discloses a configurable network system specifically modeled for network routings. A system, in one aspect, is arranged in a three-dimensional ("3D") structure including multiple cells. It should be noted that the 3D structure can be a hypercube and/or torus configuration. The cells are arranged in a substantially symmetrical configuration and are modeled via a system program. Each cell further includes eight units, which are also arranged in a 3D cube and are capable of transporting data. Each unit includes eight nodes arranged in a 3D cube and also configured to process data.

Each node, in one embodiment, includes multiple programmable devices ("PDs") capable of being programmed to perform programmed function according to modeled policies. PDs, for instance, can be modeled by a compiler to perform a specific task(s) such as searching function. It should be noted that each unit may include additional PDs to increase its computing power. PDs, in one example, are arranged in a square configuration over a substrate having multiple neighboring PDs and can be modeled in accordance with a system program for a particular task(s) such as data transmission. The system also includes a clock distributor, which further includes a long-term clock providing long-term accuracy, and a short-term clock providing short-term accuracy. In one embodiment, the long-term clock is a global positioning system ("GPS") clock and the short-term clock is an atomic clock.

FIG. 1A is a computer network topology 100 illustrating a network environment having a synthetic system 130 in accordance with one embodiment of the present invention. In one aspect, synthetic system 130 is coupled with networks 101-103 and a local area network ("LAN") 106 for data communication. Wide-area network 102, for instance, includes the Internet, or other proprietary networks including America On-Line™, SBC™, Microsoft Network™, and Prodigy™. Wide-area network 102 may further include network backbones, long-haul telephone lines, Internet service providers, various levels of network routers, and other means for routing data between computers. It should be further noted that the underlying concept of the exemplary embodiment of the present invention would not change if one or more blocks (systems or networks) were added to or removed from topology 100.

Synthetic system 130, in one embodiment, includes multiple processing units capable of providing one or more functions such as searching and routing functions. System 130 may also couple to other devices such as servers 104 or server pools that allow system 130 to expand its computing capabilities. An advantage of using a synthetic system 130 is that it contains basic configurable "policy-less" hardware, which can be modeled or programmed into a task-specific machine. Synthetic system 130, in one aspect, includes cells connected together in a 3D configuration such as a hypercube or a torus topology.

LAN 106 allows client systems 114-116 to communicate with each other through LAN 106 and to communicate with synthetic system 130 via LAN 106. Using conventional network protocols, system 130 can communicate with various client systems 110-112, supplier 120 and storage device 122. For example, client system 110 submits a search request to synthetic system 130 via wide-area network 102 and synthetic system 130 subsequently routes a search result from computer 140 to client system 110 via networks 101-102.

Figure 1B:
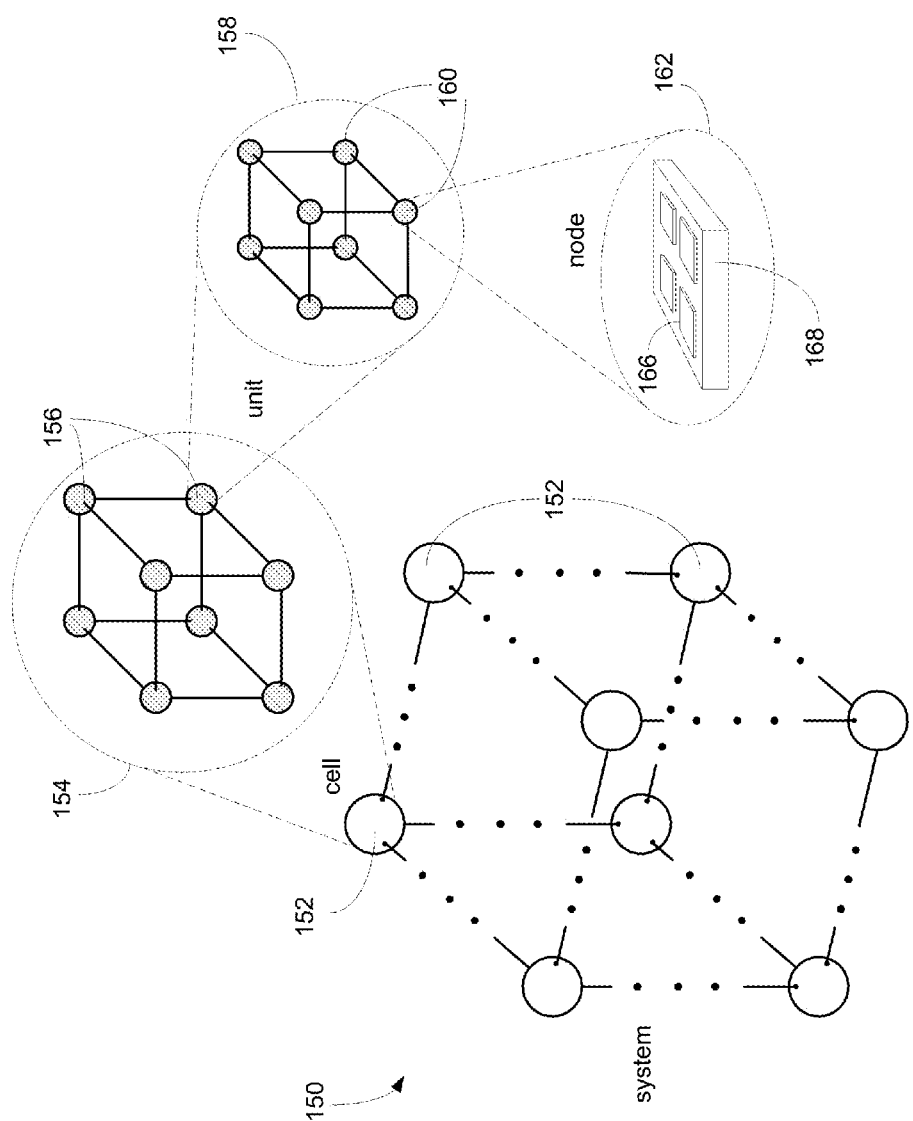
FIG. 1B is a logic block diagram illustrating a synthetic configurable system in accordance with one embodiment of the present invention.

Having briefly described one embodiment of the network environment in which the exemplary embodiment(s) of present invention operates, FIG. 1B illustrates an example of a configurable 3D synthetic system 150, which can be modeled or programmed to perform a task specific operation, such as a searching function, a routing function, and the like. It will be apparent to those of ordinary skills in the art that other alternative system architectures may also be employed.

FIG. 1B is a logic block diagram illustrating a synthetic system 150 in accordance with one embodiment of the present invention. Synthetic system 150, in one aspect, includes a set of cells 152 connected together in a hypercube topology using various connections including optical connections. Synthetic system 150, in one example, includes sixty-four (64) cells 152 structured in a 3D configurable hypercube or torus configuration. Note that system 150 may include other 3D configurations including 8, 27, 64, 125, 216, or the like. It should be further noted that the underlying concept of the exemplary embodiment of the present invention would not change if one or more blocks (cells or units) were added to or removed from synthetic system 150.

Referring back to FIG. 1B, synthetic system 150 is organized in a three dimensional cells arranged in a hypercube topology. Each cell 152 further includes a group of units 156 organized in a 3D hypercube topology as indicated by numeral 154. In one embodiment, each cell 152 includes eight (8) units arranged in a 3D hypercube. It should be noted that other 3D configurations may be used to organize each cell 152. Also, each cell 152 can include additional units 156 such as a 3×3 cube having twenty-seven (27) units per cell. Each unit is, in one embodiment, further organized into a three dimensional structure of nodes 160 indicated by numeral 158. It should be noted that it does not alter the scope of the present exemplary embodiment(s) of the present invention if additional nodes are added to or removed from unit 160.

Each node 160 further includes multiple programmable devices 166 attached to a substrate 168 as indicated by numeral 162. Programmable devices 166 can be FPGA or PLD or a combination of FPGA and PLD. In one embodiment, programmable devices 166 can be programmed or reprogrammed to model a target specific machine. It should be noted that it does not alter the scope of the present exemplary embodiment(s) of the invention if additional programmable devices are added to or removed from node 160.

A policy-less simple machine can be categorized as a system, which may include rudimentary system rules for accepting modeling code, computing capabilities, storing data, and remembering nonvolatile information such as bitmaps for a programmable device. Nonvolatile flash memory can be used for remembering capability such as bitmaps. Additional necessary system policy(s) will be programmed by a system program such as a compiler or other types of firmware, which can model programmable device 166 to perform specific tasks. Synthetic system 150 is a configurable machine, which is symmetrical with sufficient bandwidth, and can be easily modeled by compiler.

An advantage of using synthetic system 150 is that it is flexible and it is not confined by various network protocols such as TCP/IP (Transmission Control Protocol/Internet Protocol), HTTP (Hypertext Transfer Protocol), SMTP (Simple Mail Transfer Protocol), or the like. Because the system can be modeled to a rudimentary simple level, the destination and source devices know exactly what types of data they are transporting. For example, the destination device understands how to process the bit stream sent by the source device.

Another advantage of modeling a machine to a low level processing machine is simple and fast operations. Although a low level system can not do a lot, it can perform a few tasks accurately and quickly, such as identifying a search result quickly in response to a search request.

Figure 2A:
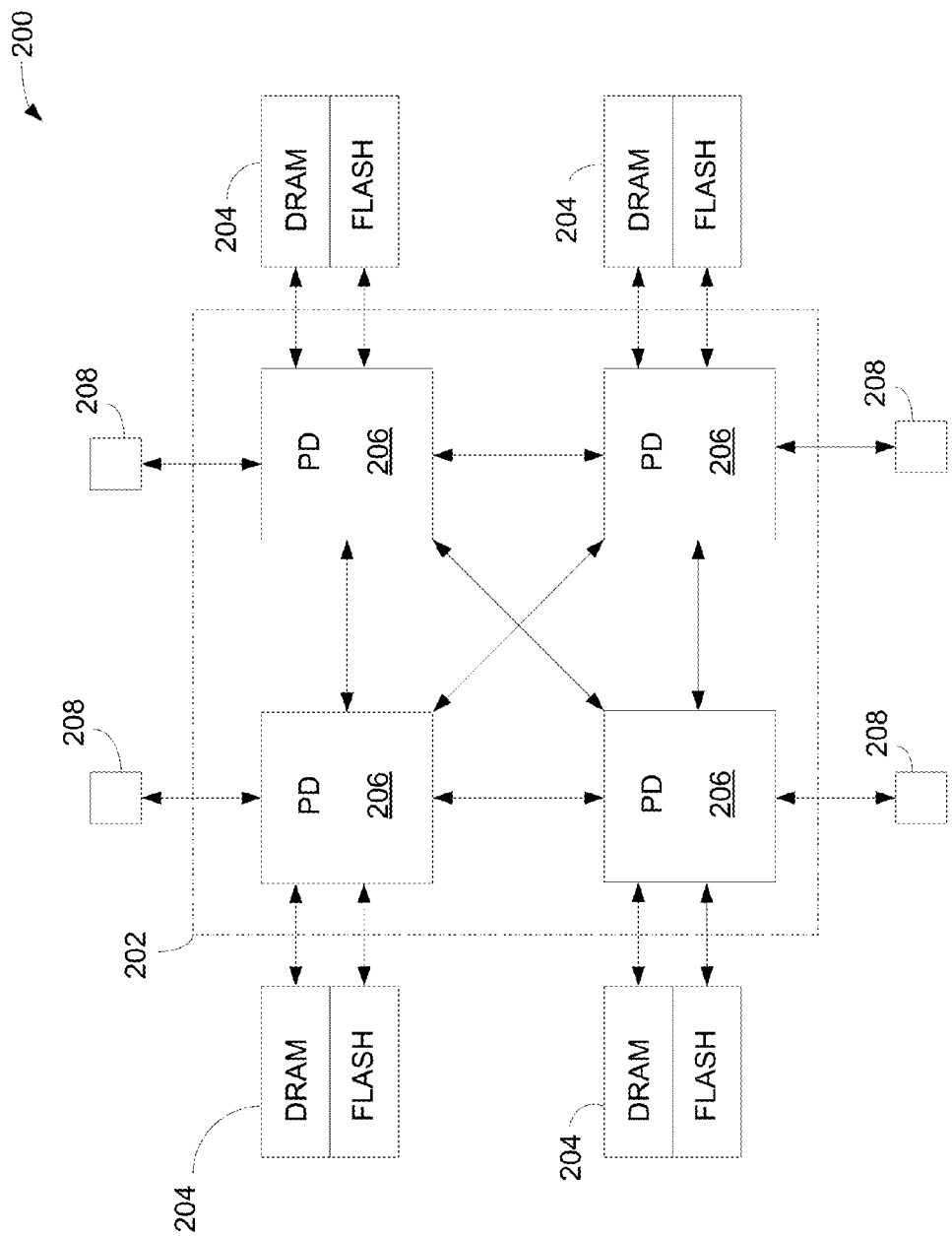
FIG. 2A is a hardware logic block diagram illustrating a node having programmable devices in accordance with one embodiment of the present invention.

FIG. 2A is a hardware block diagram 200 illustrating a node 202 having programmable devices 206 in accordance with one embodiment of the present invention. Node 202, in one aspect, is a basic building block for synthetic system 130 as shown in FIG. 1A, and includes multiple programmable devices ("PD") 206 arranged in a uniform configuration. In one embodiment, node 202 includes four (4) PDs 206 connected by a mesh connection, wherein the mesh connection enables every PD 206 to communicate to other three (3) neighboring PD 206 directly without hopping. Diagram 200 further includes memory components 204 and connectors 208, wherein connectors 208 are used to communicate with other nodes. It should be further noted that the underlying concept of the exemplary embodiment of the present invention would not change if one or more blocks (systems or networks) were added to or removed from diagram 200.

PD 206 is a reconfigurable or rewritable electronic circuit that can be programmed via programming code such as bitmaps to perform one or more desirable functions. PD 206, for example, can be a field-programmable gate array ("FPGA") or programmable logic device ("PLD"), and provides rudimentary programmable computing element. It should be noted that node 202 may include more than four (4) PDs. For example, a node may include six (6) PDs, eight (8) PDs, sixteen (16) PDs, or the like. Alternatively, node 202 may just have one (1) PD 206. In another embodiment, node 202 is configured to activate or deactivate a portion of available PDs depending on the needs of the application. It should be noted that PDs 206 may include Complex Programmable Logic Device ("CPLD"), Programmed Array Logic ("PAL"), Generic Array Logic ("GAL"), or a combination of FPGA, PLD, CPLD, PAL, and GAL.

Each memory component 204 includes a dynamic random access memory ("DRAM") and a non-volatile Flash memory. While DRAM is used for scratch memory during computing operations, Flash memory stores bitmaps dictating the behavior of associated PD 206. For example, DRAM can be a one (1) gigabit ("GB") double-data-rate two synchronous dynamic random access memory ("DDR2 SDRAM") while Flash can be a sixteen (16) GB multi-level cell ("MLC") nonvolatile memory. Bitmaps, which can be loaded or reloaded by a compiler or system program to flash memory, are used for controlling the functions of PD 206. The capability of reprogramming enables PD 206 to perform programmed functions based on modeled system policy. During an operation, memory components 204 are used to reconfigure PDs 206 with programmed policies such as computation, storage, and communication. It should be noted that memory components 204 may include Flash memory or other types of nonvolatile memories, such as Electrically Erasable Programmable Read-Only Memory, Erasable Programmable Read-Only Memory, or Electrically Erasable Programmable Read-Only Memory.

Connectors 208 are inner-board inter-connectors used for signal transmission between nodes. The inner-board inter-connector, for example, is capable of transmitting and receiving low voltage differential signaling ("LVDS"). Alternatively, the inner-board inter-connector can receive or transmit low power data signals transmitted between complementary metal oxide semiconductor ("CMOS") devices.

Node 202, in one embodiment, can be modeled in accordance with policies from a system program, such as a compiler. The policies can be, for example, stored in Flash memories, and they facilitate or dictate types of available functions, such as network routing, Ethernet protocol, instructions sets, and peripherals support that a PD or a node can perform. Node 202 may also be referred to other names such as a programmable circuit, programmable system, or the like.

Figure 2B:
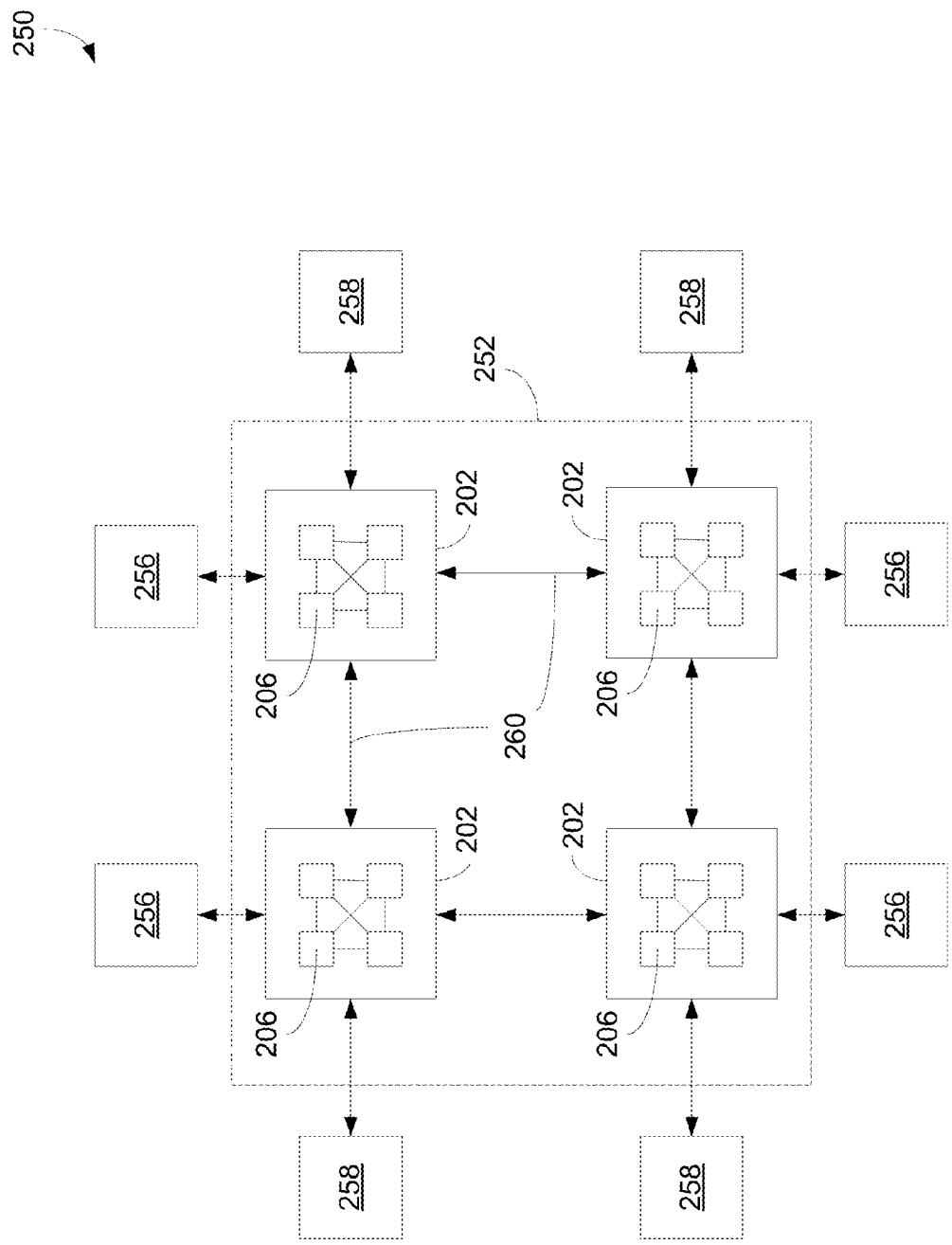
FIG. 2B is a hardware block diagram illustrating a board having multiple nodes in accordance with one embodiment of the present invention.

FIG. 2B is a hardware block diagram 250 illustrating a board 252 having multiple nodes 202 in accordance with one embodiment of the present invention. Diagram 250 includes a printed circuit board 252, board-to-board connectors 258, and endpoint connectors or components 256. Board 252, in one embodiment, includes four (4) nodes 202, wherein each node 202 further includes four (4) PDs 206. It should be further noted that the underlying concept of the exemplary embodiment of the present invention would not change if one or more blocks (systems or networks) were added to or removed from diagram 250.

Printed circuit board ("PCB") 252 is a multi-layered mechanical structure with electrical conductive pathways. PCB 252 can be fabricated using non-conductive substrate for housing multiple nodes 202. In one example, nodes 202 are coupled to at least two neighboring nodes via cables 260. Cables 260, which can be a set of wires or connections, are used to interconnect nodes through inner-board inter-connector 256. It should be noted that PCB 252 may be configured to house additional nodes 202. Alternatively, PCB 252 may house less than four (4) nodes 202, but the concept of the exemplary embodiment(s) of the invention is the same. PCB 252 may also be referred to as a printed wiring board and etched writing board.

Board-to-board connectors 258 are deployed to bind additional PCBs to form a larger component entity. Each node 202 within PCB 252 is coupled with a board-to-board connector 258, wherein four nodes 202 are coupled to four board-to-board connectors 258. As such, if two PCBs 252 are coupled together, a 3D hypercube configuration with eight (8) nodes is formed wherein board-to-board connectors 258 are used for coupling.

In addition to board-to-board connectors 258, diagram 250 further includes four (4) endpoint connectors or components 256. It should be noted that more endpoint connectors 256 may be added if additional node(s) is added. Endpoint components 256, in one embodiment, are used to transfer data in and out of PCB 252. Endpoint components 256 can be, for example, optical endpoint components, copper endpoint components, and network connectors.

Figure 3:
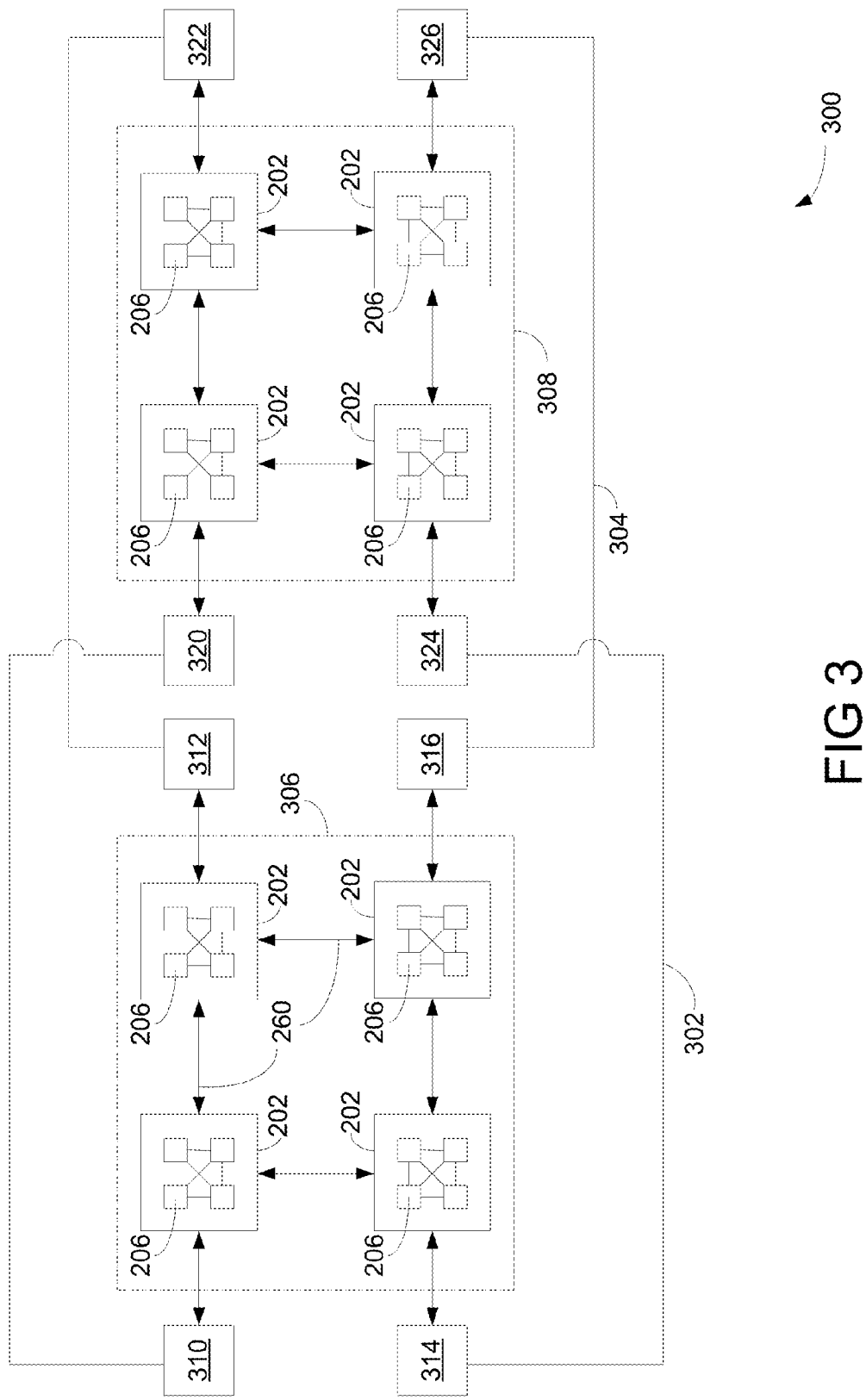
FIG. 3 is a hardware block diagram illustrating a unit arranged in two boards in accordance with one embodiment of the present invention.

FIG. 3 is a hardware block diagram illustrating a unit 300 arranged in two boards in accordance with one embodiment of the present invention. Unit 300 includes a pair of PCBs 306-308 wherein each PCB further includes four (4) nodes 202 connected by cables 260. While PCB 306 includes board-to-board connectors 310-316, PCB 308 includes board-to-board connectors 320-326. It should be further noted that the underlying concept of the exemplary embodiment of the present invention would not change if one or more blocks (systems or networks) were added to or removed from unit 300.

Unit 300, in one embodiment, is arranged in a 3D topology, such as a hypercube and/or torus structure. For example, PCB 306 can be stacked logically on top of PCB 308 wherein board-to-board connectors 310-316 are coupled to board-to-board connectors 320-326 via wires 302-304. Since each PCB contains four (4) nodes, a pair of PCBs can form a 3D hypercube as illustrated in FIG. 3. It should be noted that unit 300 can include additional nodes or PCBs to enhance its performance. An advantage of using hypercube structure is to provide sufficient connections with minimal distance.

Board-to-board connectors 310-326, in one aspect, employ various different mounting contactors. For example, board-to-board connectors include through-hole technology, surface mount technology, press-fit, compression, or ribbon cable connection. In one embodiment, four nodes 202 are placed on the printed circuit board with equal distance from each other in a manner resembling a square. Each node includes four (4) PDs 206 and is connected by way of inner-board connectors to form a hypercube, which can be referred to as hypercube connected nodes. Each unit, for example, includes thirty-two (32) interconnected PDs 206 capable of providing various computations, transportations, and data storage.

Figure 4:
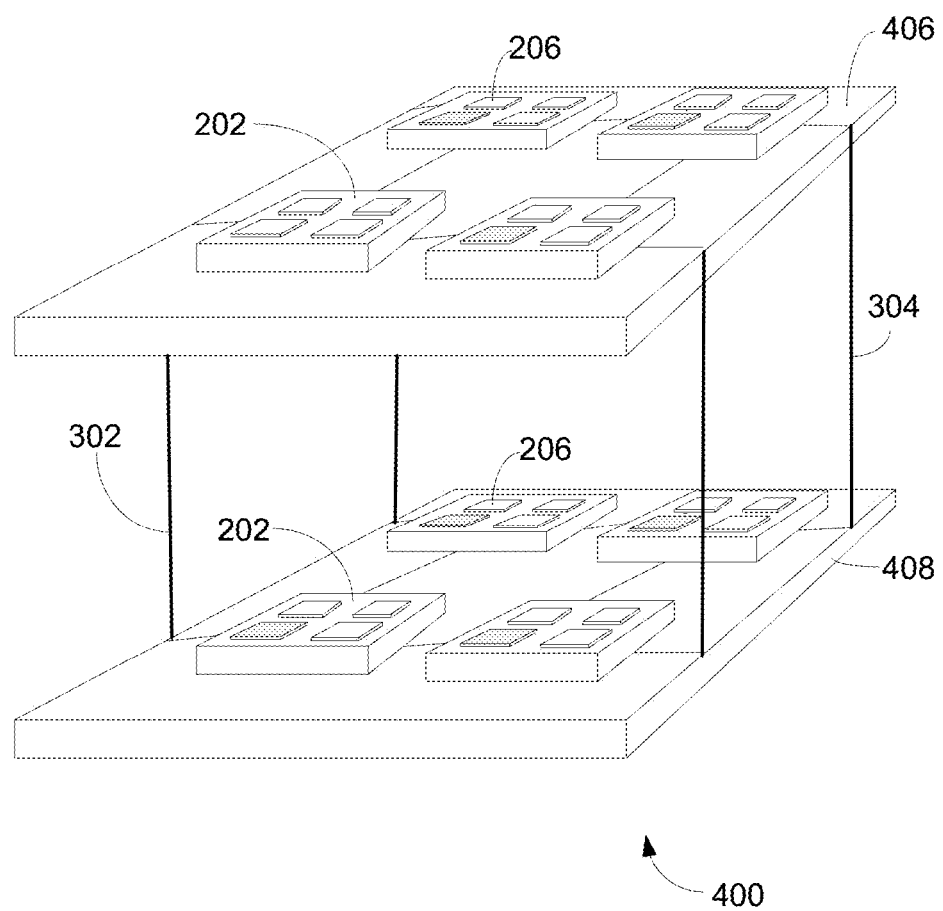
FIG. 4 is a three-dimensional diagram illustrating two boards connected to each other to form a unit in accordance with one embodiment of the present invention.

FIG. 4 is a three-dimensional diagram illustrating two (2) boards 406-408 connected to each other to form a unit 400 in accordance with one embodiment of the present invention. As illustrated, unit 400 includes a top board 406 coupled together, in parallel, to a bottom board 408 by way of board-to-board connectors via wires 302-304. Note that the space between the two boards is dictated by the type of connector used and the space allocated within a system structure. Further note that the construction of unit 400 can be designed, not in parallel, but rather side-by-side. Unit 400 includes a board pair 406-408 with four nodes 202 per board, and four PDs 206 per node 202. It should be further noted that the underlying concept of the exemplary embodiment of the present invention would not change if one or more boards (or nodes) were added to or removed from unit 400.

Figure 5:
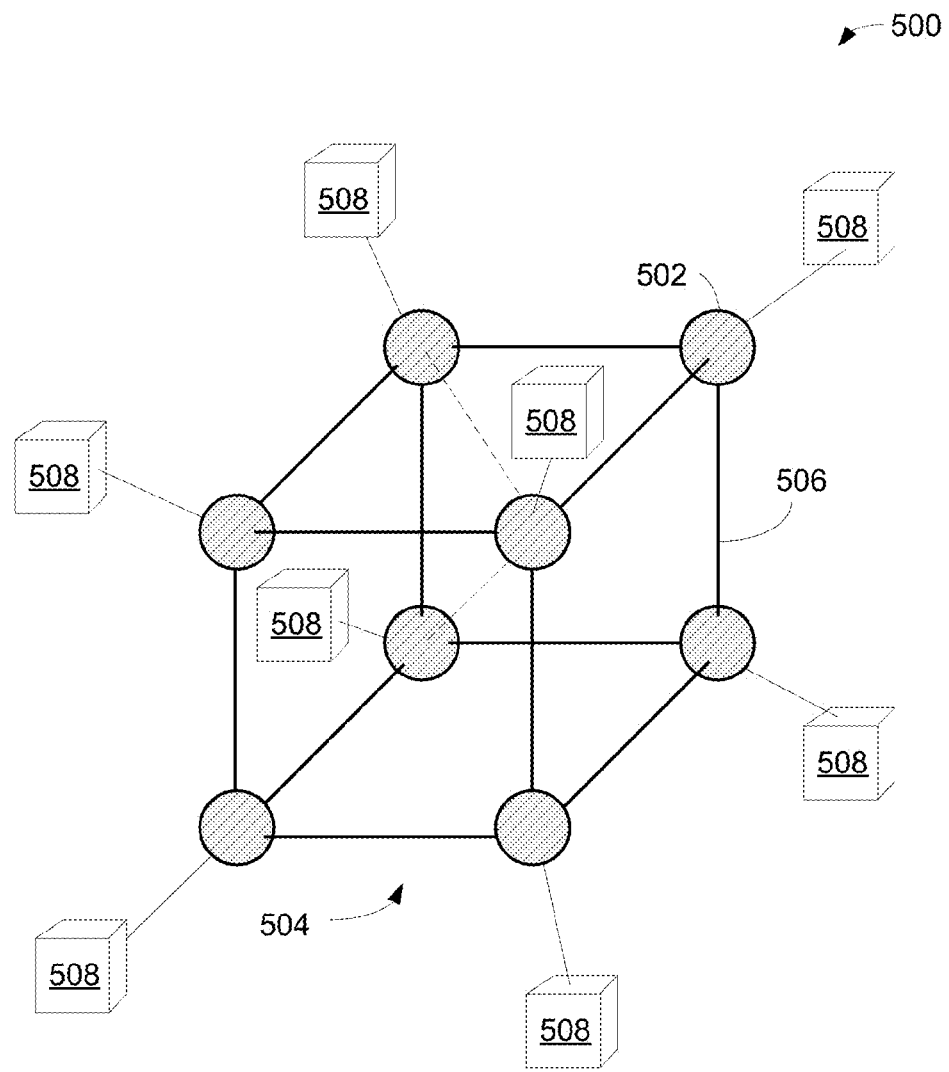
FIG. 5 is a three-dimensional diagram illustrating a unit in a cube configuration in accordance with one embodiment of the present invention.

FIG. 5 is a three dimensional ("3D") diagram illustrating a unit 500 in a cube or hypercube configuration in accordance with one embodiment of the present invention. Unit 500 is configured in a hypercube configuration, wherein each corner of cube 504 sets a node 502. Since a cube or hypercube has eight corners, unit 500 includes at least eight nodes 502, which are interconnected by connections or local inter-connectors 506. In one aspect, each node 502 is physically coupled to at least three neighboring nodes 502. Alternatively, a node 502 can be coupled to four or more neighboring nodes as indicated by dotted lines. As indicated earlier, a hypercube configuration can be formed by a board pair.

Unit 500 also includes multiple endpoint components 508, wherein each node 502 has at least one endpoint component 508. A function of endpoint component 508 is to provide communication between nodes and devices outside of unit 500. Another function of endpoint component 508 is to provide conversion between optical signals and electrical signals. In one embodiment, unit 500 is arranged in a hypercube topology consisting eight (8) nodes 502, wherein the hypercube can be constructed by various inner-board interconnections when two PBCs are combined. Each node within unit 500 is essentially coupled to an endpoint component 508 for ingress and egress data transmission. It should be noted that the underlying concept of the exemplary embodiment of the present invention would not change if one or more nodes (or boards) were added to or removed from unit 500.

In one embodiment, unit 500 contains a microprocessor, which is used to initialize PD or PDs thereby they can function as, for example, network elements. The microprocessor includes or is capable of accessing sufficient non-volatile storage capacity capable of programming all of the PDs in a unit. The microprocessor is capable of rebooting PDs within unit 500 based on a set of conditions. In other words, each unit can be independently rebooted or shut down in accordance with the detected conditions. The conditions may include power failure, excessive temperature, time-out, special commands, and the like. Special commands, for instance, may be issued by a PD, unit, cell, and so forth. Automatic rebooting or recovering within a unit, a node, or a cell, can also be referred to as a "dead man's switch." An advantage of using the concept of dead man's switch is to avoid rebooting the entire synthetic system.

Figure 6:
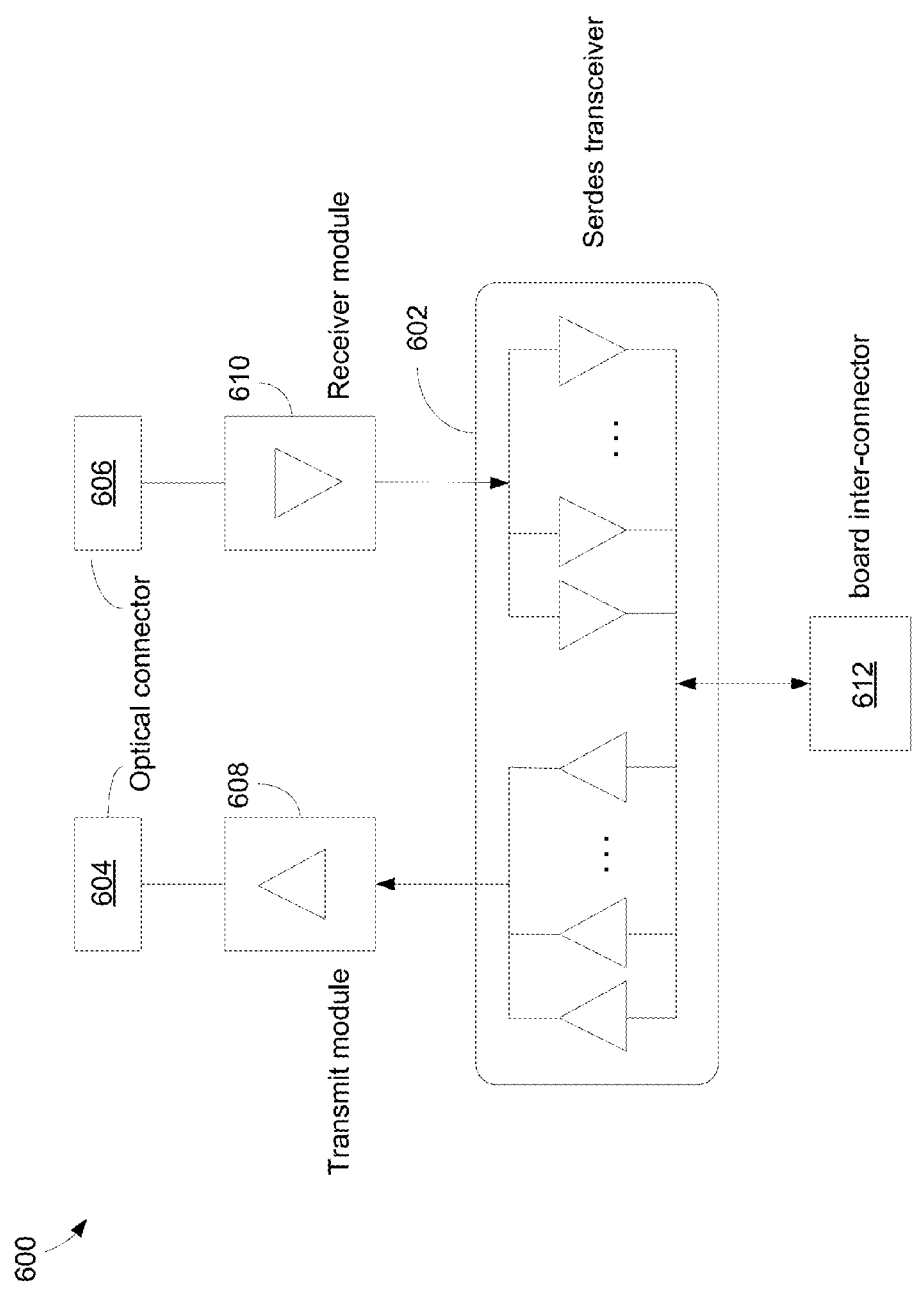
FIG. 6 is a block diagram illustrating an end-point component connected between electrical and optical devices in accordance with one embodiment of the present invention.

FIG. 6 is a block diagram illustrating an endpoint component 600 connected between electrical and optical devices in accordance with one embodiment of the present invention. Endpoint component 600 includes optical connectors 604-606, a transmit module 608, a receiver module 610, a serializer/deserializer ("SerDes") transceiver 602, and a board inter-connector 612. It should be further noted that the underlying concept of the exemplary embodiment of the present invention would not change if one or more blocks (or circuitry) were added to or removed from endpoint component 600.

SerDes transceiver 602, in one example, includes a receiving functional block and a transmitting functional block and is capable of converting parallel data to serial data and vice versa. A function of SerDes transceiver 602 is to provide ingress and egress data transmission between a unit and a device outside of unit. SerDes transceivers 602 are, for example, capable of facilitating the needs of high-end transmission systems for rapid ingress and egress data transmission. It should be noted that SerDes transceiver 602 may also be referred to as an integrated circuit or logic communications device. SerDes transceiver 602 further includes a board inter-connector used to couple to the board. Transmit module 608 is coupled to an optical connector 604 for transmitting optical data, while receiver module 610 is coupled to an optical connector 606 for receiving optical data. SerDes transceiver 602 is capable of receiving and transmitting massive amount of data in parallel. A multi-ports SerDes transceiver 602, such as a 12-port SerDes, can transmit and receive 30 gigabit per second in parallel. For example, SNAP12, a 12-channel SerDes transceiver 602, is capable of supporting twelve (12) parallel optics converting electrical signals to optical signals and vice versa. Transmit module 608 and receive module 610 may employ vertical-cavity surface-emitting laser (VCSEL) to transmit or receive optical signals via fibers.

Figure 7:
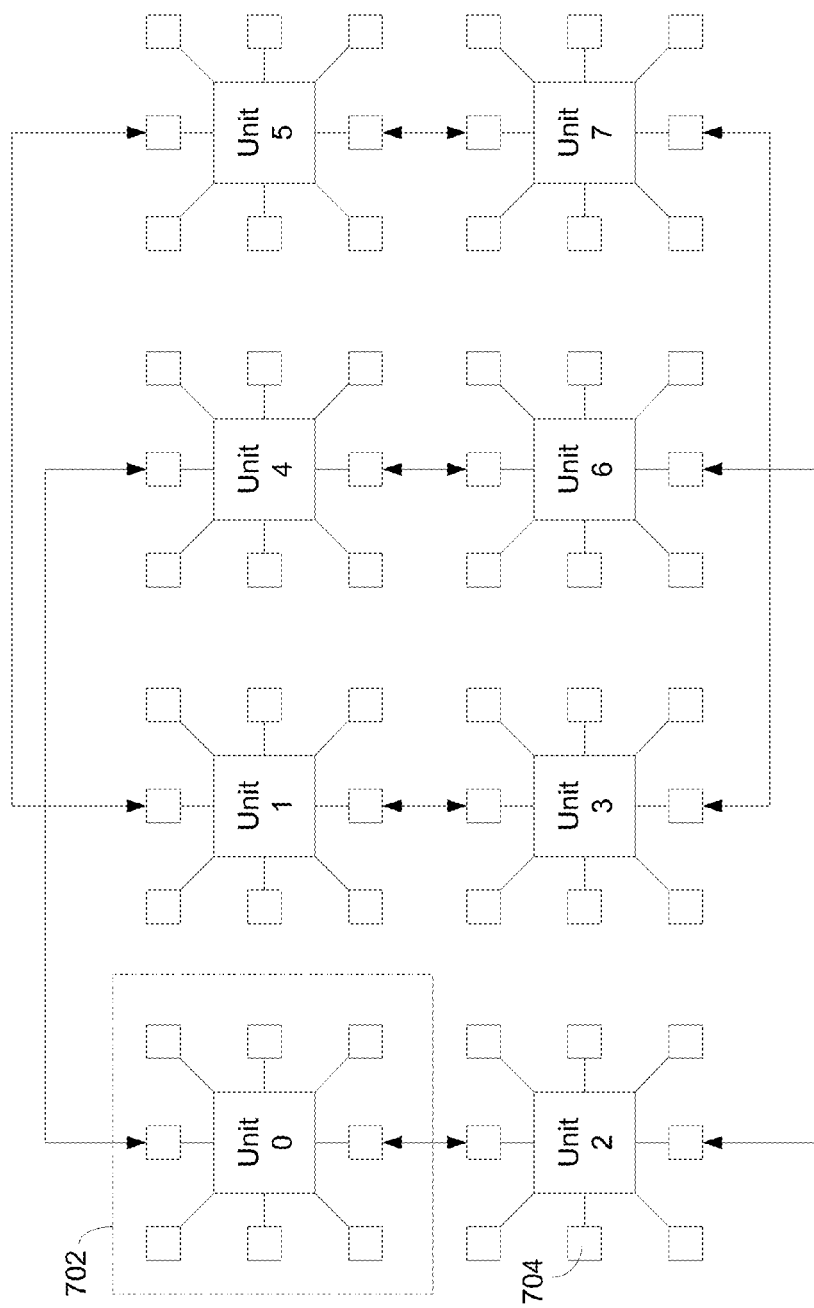
FIG. 7 is a hardware block diagram illustrating a cell having eight (8) units in accordance with one embodiment of the present invention.

FIG. 7 is a hardware block diagram illustrating a cell 700 having eight (8) units 702 in accordance with one embodiment of the present invention. Cell 700, in one embodiment, includes eight (8) units 0-7 organized in a hypercube topology. It should be noted that cell 700 can also be arranged in other types of 3D configurations such as a torus configuration. It should be further noted that the underlying concept of the exemplary embodiment of the present invention would not change if one or more units (or nodes) were added to or removed from cell 700.

Cell 700, in one example, includes eight (8) units, wherein each unit 702 includes multiple endpoint components 704. Two (2) endpoint components 704 from each unit, in one embodiment, are used for coupling to other similar units to form a uniform hypercube configuration. The hypercube topology provides logical symmetry between units 0-7 with relatively short distance between units 702. In one aspect, each cell includes a power distribution and clock signal distribution.

Each cell 700 is powered individually, whereby one power failure takes down just a single cell. Cell 700 includes a power backplane for accommodating board pairs, wherein each board pair accepts certain amount of power such as 12 volts ("V") DC (direct current). The backplane of a cell can be further configured to convert a higher voltage to a lower voltage such as converting from 48 V to 12 V. For example, cells may be loaded into racks which include backplane, wherein the backplane provides 48 V DC from the racks. Alternatively, a rack may accept 38 V DC from a central DC power source in the system.

An advantage of having an independent power distribution for each cell is to provide power failure protection against defects in power modules. For example, if a power module fails, the failure would affect a single cell and not the entire synthetic system. To reduce jitter tolerance, each cell 700 has a dedicated copy of master clock tree. The dedicated copy of master clock tree allows accurate signal communications between the cells in the system.

Figure 8:
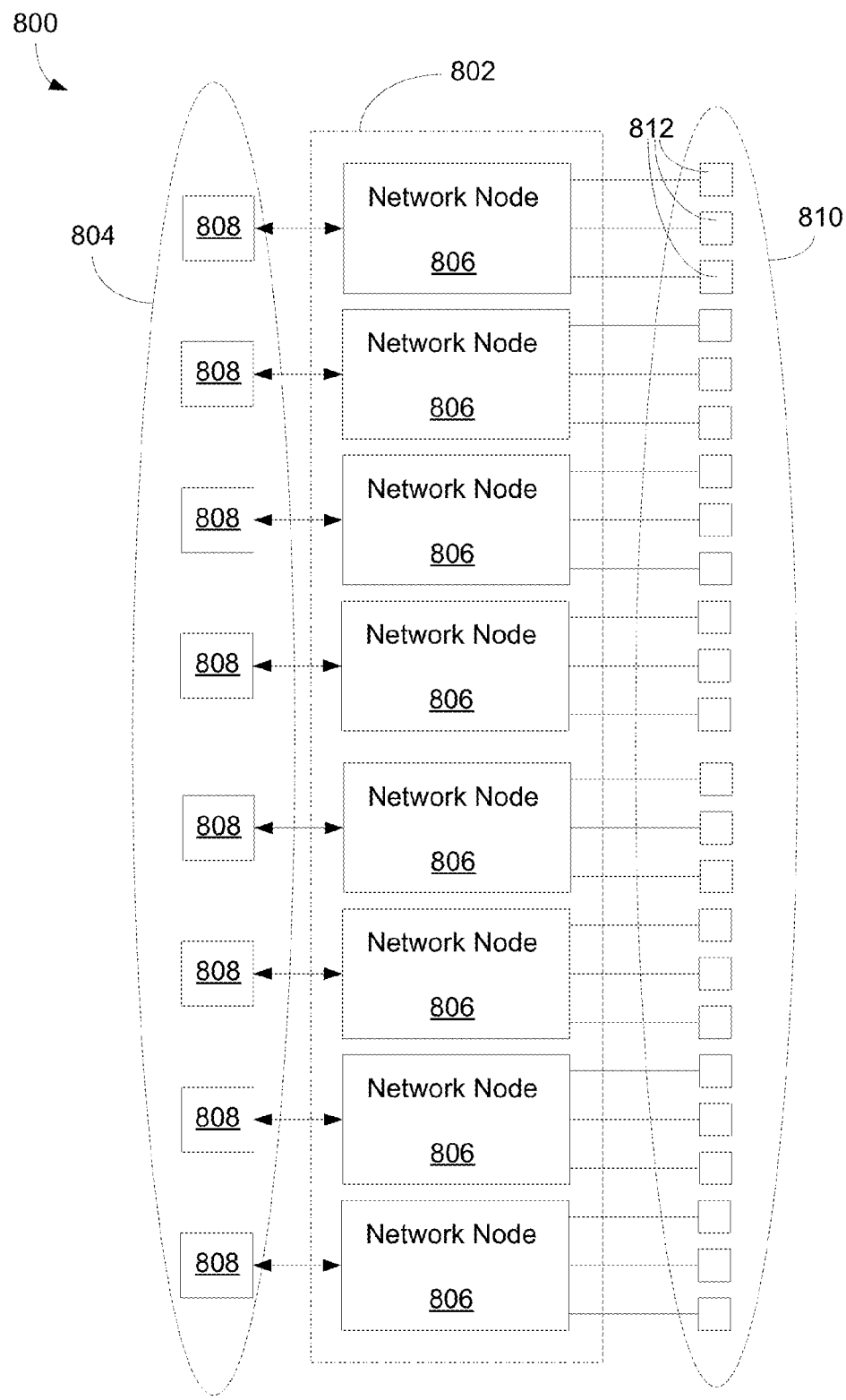
FIG. 8 illustrates a network unit having PDs in accordance with one embodiment of the present invention.

FIG. 8 illustrates a network unit 800 having PDs in accordance with one embodiment of the present invention. Network unit 800 includes an optical connection 804, network block 802, and an electrical connection 810, wherein electrical connection 810 includes twenty-four (24) 10 gigabit Ethernet connectors 812. While network block 802 includes eight (8) network nodes 806, optical connection 804 includes eight (8) optical inter-connectors 808, such as SNAP12 connectors. It should be further noted that the underlying concept of the exemplary embodiment of the present invention would not change if one or more units (or nodes) were added to or removed from network unit 800.

Each cell, in one embodiment, includes a network unit 800 for data communication between cell and devices outside of the cell. Optical inter-connectors 808 are used by network unit 800 to communicate with other devices outside of the cell. Ethernet connectors 812, on the other hand, are used to transfer and convert data from optical to digital and vice versa. Ethernet connectors or transceivers 812 translate the ingress and egress data to and from Ethernet communication networks. It should be noted that network unit 800 is programmable for modeling the unit to perform modeled functions such as searching and/or routing functions.

Figure 9:
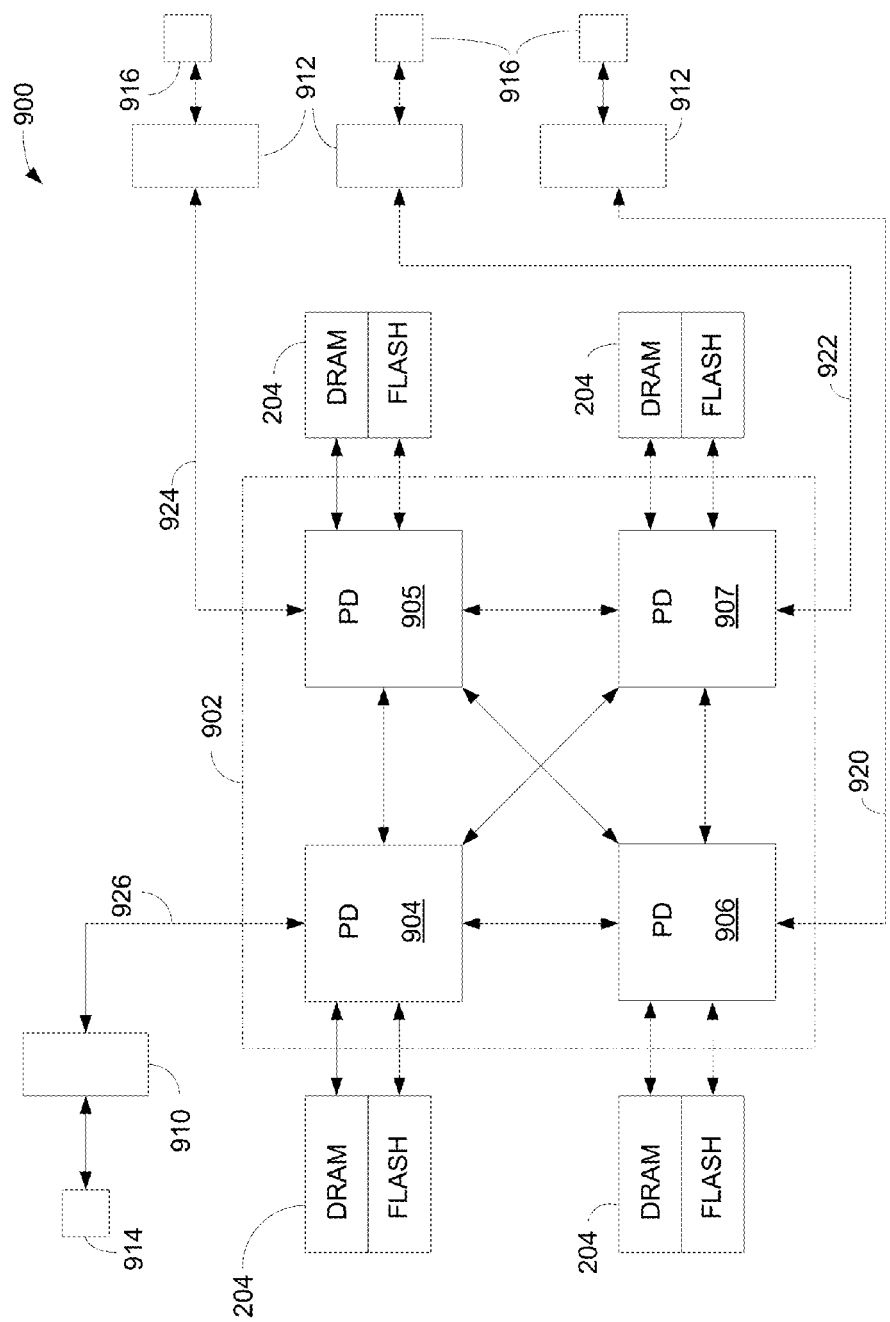
FIG. 9 is a hardware block diagram illustrating a network node having multiple programming devices for data transfer in accordance with one embodiment of the present invention.

FIG. 9 is a block diagram illustrating a network node 900 having PDs 904-907 for data transfer in accordance with one embodiment of the present invention. Network node 900, as node 202 illustrated in FIG. 2A, is an essential building block for the synthetic system, and includes multiple PD 904-907 arranged in a uniform configuration. In one embodiment, network node 900 includes four (4) PDs 904-907 connected by a mesh connection, wherein the mesh connection enables every PD to communicate with other three (3) neighboring PD directly without hopping. Each PD is further coupled to a memory component 204 for storing bitmaps for programming the PD as well as computational storage. It should be further noted that the underlying concept of the exemplary embodiment of the present invention would not change if one or more blocks (or PDs) were added to or removed from node 900.

PDs 904-907 are reconfigurable or rewritable electronic circuits disposed over a substrate or a board 902, wherein the PDs can be programmed to perform one or more desirable functions. A PD, for example, can be a field-programmable gate array ("FPGA") or programmable logic device ("PLD"), and provides rudimentary programmable computing element. It should be noted that network node 900 may include four (4) PDs, six (6) PDs, eight (8) PDs, or the like. Alternatively, network node 900 may just have a single PD. Moreover, network node 900, in one aspect, is configured to deactivate or activate one or more PDs based on computational demand. It should be noted that PDs may include Complex Programmable Logic Device ("CPLD"), Programmed Array Logic ("PAL"), Generic Array Logic ("GAL"), or a combination of FPGA, PLD, CPLD, PAL, and GAL.

Network node 900 further includes multiple transceivers 910-912, wherein transceiver 910 is connected to PD 904 and transceivers 912 are connected to PDs 905-907. In one embodiment, transceiver 910 is coupled with an optical inter-connector 914 and is capable of transmitting data or data packets between optical inter-connector 914 and PD 904. As discussed earlier, optical inter-connector 914 is further coupled with other optical device(s) outside of a cell. In another aspect, transceiver 910 is further configured to provide conversion between optical signals and electrical signals.

Transceivers 912, in one embodiment, are connected with Ethernet based inter-connectors such as 10 GB Ethernet physical inter-connectors or 1 Terabit Ethernet physical inter-connectors 916. Transceivers 912, for example, could process data at a speed between 10 GB and 1 Terabit in parallel. It should be noted that physical inter-connectors 916 are used for ingress-egress connection for network node 900, wherein ingress-egress connection of network node 900 can include three (3) or more physical inter-connectors.

A function of network node 900 is to facilitate communications between cells or devices outside of cells or the synthetic system. In one embodiment, PD 904 connected with optical transceiver 910 is capable of providing packet routing. PDs 905-907, on the other hand, are connected to three (3) Ethernet electrical transceivers 912 and are capable of providing packet filing. It should be noted that PDs can be flexibly modeled or programmed to perform intended or specific modeled function(s). Packet filing is a function of converting a conventional packet coded in a typical network protocol to a modeled or programmed network protocol. It should be noted that a designer may implement network capability within the computer without affecting the overall architecture and design of the surrounding units.

In one embodiment, a network unit includes eight (8) network nodes 900 arranged in a hypercube configuration. Alternatively, the network unit can selectively add or remove any number of network nodes 900 to or from a cell depending on applications. A network unit can be placed in a cell managing egress-ingress communications for the cell. Network unit, in one aspect, is able to share the same power source and clock distribution with other surrounding units in the cell.

Figure 10:
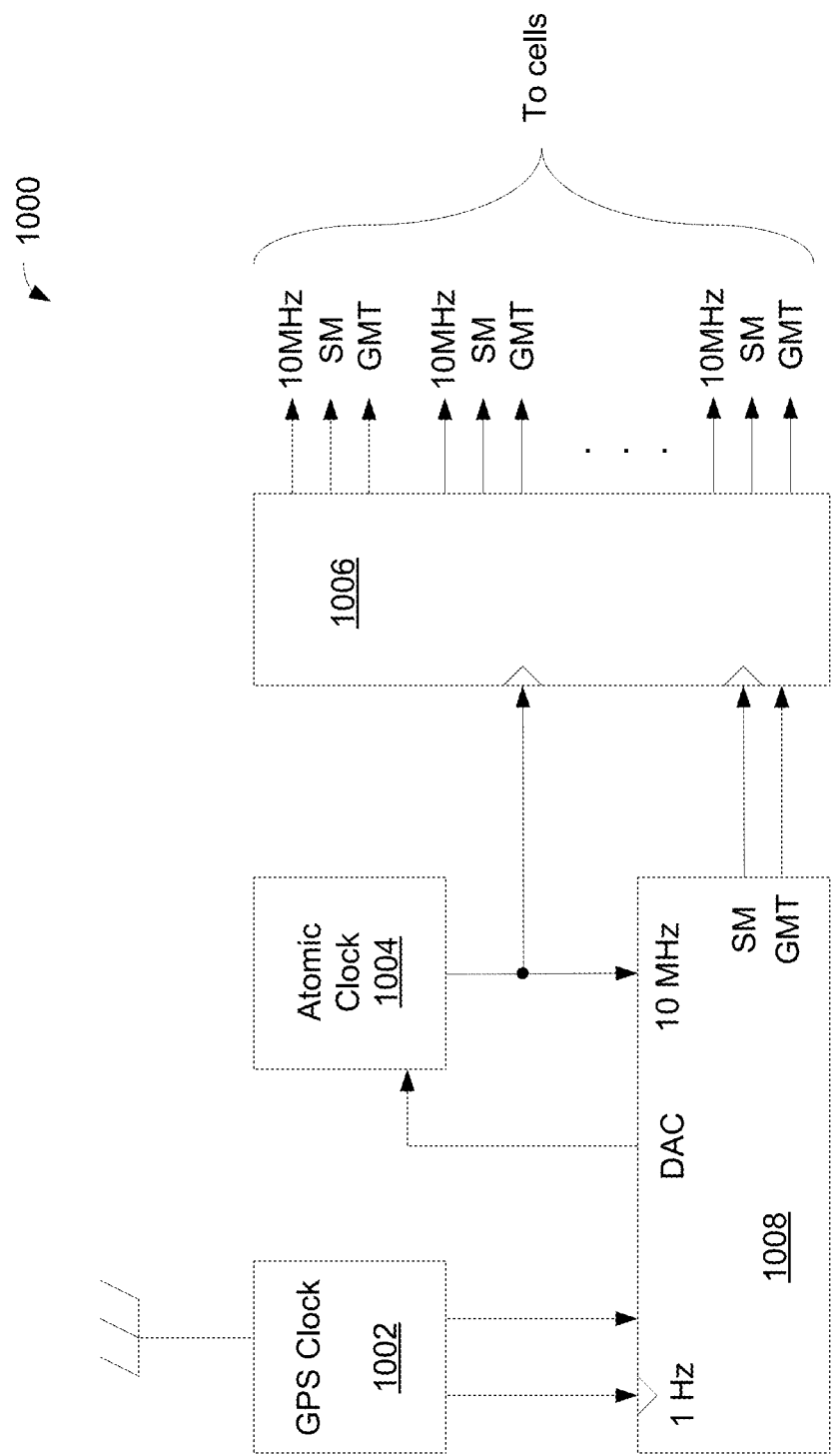
FIG. 10 is a block diagram illustrating a clock distributor having a GPS clock and an atomic clock in accordance with one embodiment of the present invention.

FIG. 10 is a block diagram illustrating a clock distributor 1000 having a GPS clock 1002 and an atomic clock 1004 in accordance with one embodiment of the present invention. Clock distributor 1000 includes a GPS clock 1002, an atomic clock 1004, a clock controller 1008, and a clock tree 1006. In one embodiment, each cell has an individual copy of clock tree and optical connected SerDes handles clock alignment between cells. For example, each cell is fed two (2) GPS stabilized atomic clock sources, which are used to create a geo-scaled clock synchronization scheme. It should be noted that the underlying concept of the exemplary embodiment of the present invention would not change if one or more blocks (or clocks) were added to or removed from distributor 1000.

GPS clock 1002 is capable of receiving highly accurate clock signals from a satellite in the space. In one aspect, GPS clock 1002 is configured to provide long-term highly accuracy clock signals to controller 1008. For example, GPS clock 1002 may provide a set number of frequencies such as 1 Hertz ("Hz") to controller 1008. Controller 1008 manages various clock signals and is capable of adjusting clock signals generated by atomic clock 1004 in accordance with clock signals provided by GPS clock 1002. Atomic clock 1004, in one embodiment, is a Rubidium clock for providing short-term accuracy clock signals. Alternatively, atomic clocks 1004 can be a Cesium clock. Atomic clock 1004 can be configured to provide a 10 Megahertz ("MHz") clock signals to controller 1008.

Controller 1008, in one embodiment, performs a function of adjusting atomic clock 1004 using a digital analog counter ("DAC"). Controller 1008 is capable of generating DAC signals in accordance with signals from GPS clock 1002 and subsequently, DAC signals are forwarded to atomic clock 1004. Upon receipt of DAC signal, atomic clock 1004 adjusts its clock signals accordingly. In other words, controller trains and adjusts the Rubidium or Cesium clock using signals from the GPS clock. In addition, controller 1008 provides a second mark clock signal ("SM") and a Greenwich Mean Time ("GMT") signal in response to clock signals from atomic clock 1004 and GPS clock 1002. GMT is the world official time, which can also be referred to as Coordinated Universal Time ("UTC"). GMT, SM, and clock signals from atomic clock 1004 such as a 10 MHz clock signal are then fed to clock tree 1006.

Clock tree 1006, in one embodiment, is a clock signal divider, which is configured to provide the same or substantially the same clock signals to all cells. For example, each cell is configured to receive a set of 10 MHz, SM, and GMT clock signals, and if the synthetic system includes 64 cells, clock tree 1006 divides clock signals into 64 sets of substantially the same clock signals. An advantage of having an atomic clock 1004 and a GPS clock 1002 is to provide accurate clock signals to PDs. For example, when GPS clock 1002 is out of commission, atomic clock 1004 can continue to provide clock signals until GPS clock is restored. It should be noted that atomic clock 1004 can be substituted with any other relatively accurate clocking devices. Similarly, GPS clock can also be replaced with other types of highly accurate clock device.

Figure 11:
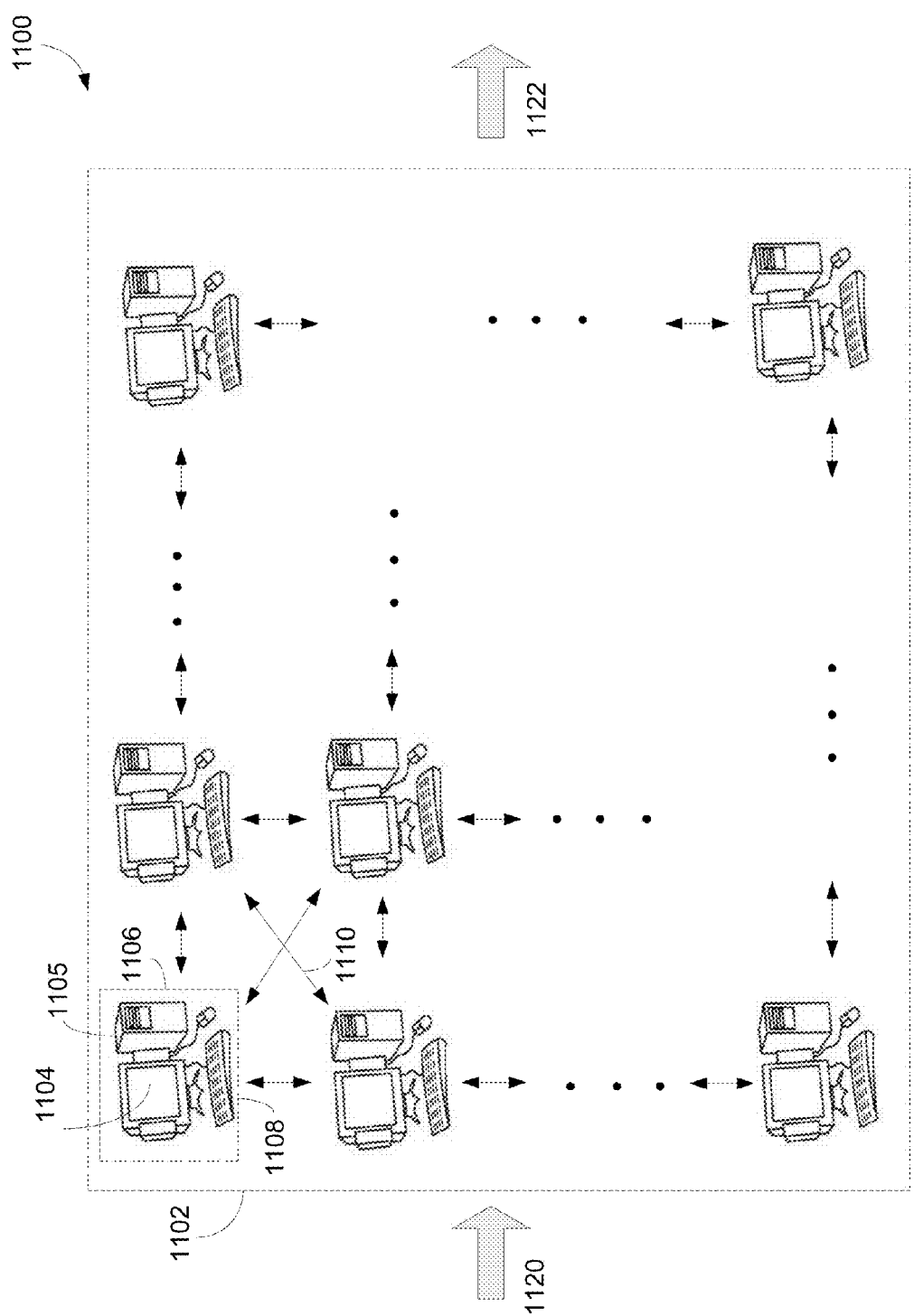
FIG. 11 is a block diagram illustrating an exemplary application of synthetic system(s) in a Web computer farm in accordance with one embodiment of the present invention.

FIG. 11 is a block diagram 1100 illustrating an exemplary application of synthetic system(s) in a Web computer farm in accordance with one embodiment of the present invention. Diagram 1100 includes an array of synthetic systems 1106 capable of receiving a massive amount of data packets 1120 and transmitting voluminous data packets 1122 at the same time. Synthetic system 116, in one embodiment, includes just machine 1105, or alternatively, includes monitor 1104, machine 1105, and keyboard 1108. Synthetic systems 1106 can be configured in a mesh connection 1110. Alternatively, synthetic systems 116 can also be configured into a hypercube configuration. It should be noted that the underlying concept of the exemplary embodiment of the present invention would not change if one or more systems (or devices) were added to or removed from farm 1100.

Since synthetic computers can be modeled to implement specific tasks, synthetic computers not only can process network data efficiently, but also consume less power. Because synthetic computers can be reprogrammed via installation of new compilers, a Web farm built with synthetic systems can be expanded or shrunk depending on the applications. Web farm 1100 can also be referred to as server clusters, clustered computers, computer ranches, server farm and computer farm.

An advantage of using a protocol-less or policy-less network system as a physical entity is that the use of the network depends on the program that is mapped onto the computer or entity. Geo-synchronized clocks guarantee low-level synchronization of various PD operations. For example, accurate clock signals across units enhance data integrity such as operation of access lock for conflicts.

The exemplary embodiment(s) of the present invention includes various processing steps, which will be described below. The steps of the embodiments may be embodied in machine or computer executable instructions. The instructions can be used to cause a general purpose or special purpose system, which is programmed with the instructions, to perform the steps of the present invention. Alternatively, the steps of the present invention may be performed by specific hardware components that contain hard-wired logic for performing the steps, or by any combination of programmed computer components and custom hardware components. While embodiments of the present invention will be described with reference to the Internet, the method and apparatus described herein is equally applicable to other network infrastructures or other data communications environments.

Figure 12:
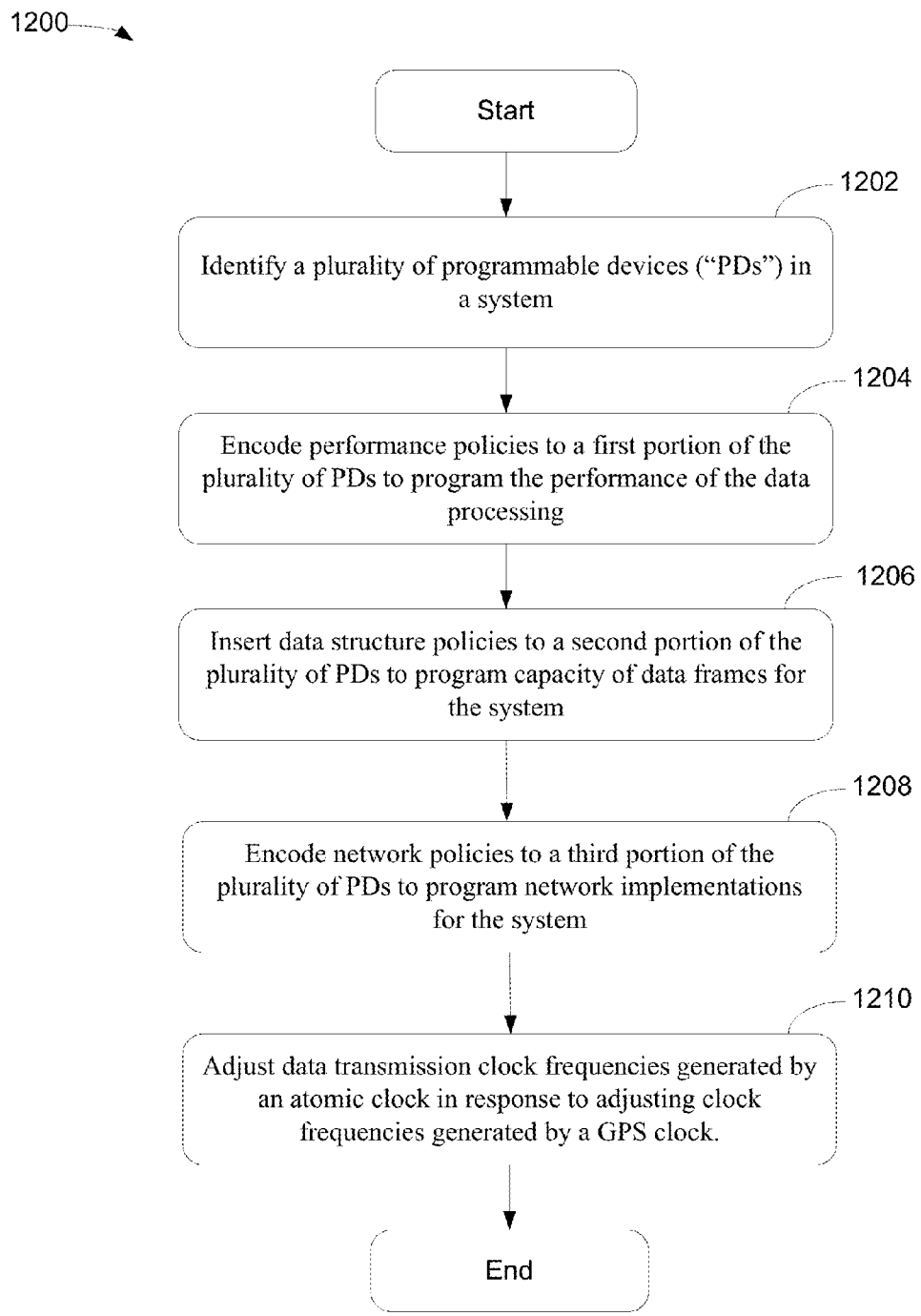
FIG. 12 is a flowchart illustrating a process of modeling a configurable computer system in accordance with one embodiment of the present invention.

FIG. 12 is a flowchart 1200 illustrating a process of modeling a configurable computer system in accordance with one embodiment of the present invention. At block 1202, a process identifies PDs in a system. The PDs are arranged in a predefined configuration with a mesh interconnection. The process uses eight (8) FPGA devices to form a unit which is capable of being modeled in accordance with policies from a system program or a compiler.

At block 1204, the process encodes performance policies to a first portion of PDs to program the performance of data processing. In one embodiment, the process identifies that the modeled system will be a network system for handling network data packets. In addition, the process defines the speed of performance. For example, the modeled system should be able to transmit a bit stream at a speed of 100 GB per second.

At block 1206, the process inserts data structure policies to a second portion of PDs to program capacity of data frames for the system. After determining a modeled network system, the process configures the data structure, such as packet payload length, header, and the like. The policy for data structure is needed in order for destinations and sources to know how to handle bit streams.

At block 1208, the process encodes network policies to a third portion of PDs to program network implementations for the system. For example, the process uses a system program or a compiler to map one or more communications networks to the PDs. It should be noted that the network may be an Ethernet, an optical network, or the like.

At block 1210 the process adjusts data transmission clock frequencies generated by an atomic clock in response to adjusting clock frequencies generated by a GPS clock. In one embodiment, the process further generates a clock tree having second mark signals and Greenwich Mean Time signals. The process is also capable of providing substantially the same clock signals to every cell in the system.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope all such changes and modifications as are within the true spirit and scope of the exemplary embodiment(s) of is present invention.

What is claimed is:

1. A clock distribution circuit, comprising:
a global positioning system ("GPS") clock capable of receiving clock signals from a satellite;
an atomic clock coupled to the GPS clock and configure to provide short-term accuracy clock signals; and
a clock controller coupled to the GPS clock and configured to provide data transmission clock signals,
wherein the clock controller includes a digital analog counter ("DAC") for generating DAC signals which are forwarded to the atomic clock for adjusting the short-term accuracy clock signals, wherein the clock controller receives signals from the GPS clock and the atomic clock, and outputs second mark ("SM") clock signals and Greenwich Mean Time ("GMT") signals to a clock tree which is configured to generate SM signals, GMT signals, and 10 MHz (megahertz) clock signals.

2. The circuit of claim 1, wherein the GPS clock is configured to receive real-time clock signals and provide the real-time clock signals to the clock controller.

3. The circuit of claim 2, wherein the clock controller adjusts atomic clock signals generated by the atomic clock in response to the real-time clock signals from the GPS clock.

4. The circuit of claim 3, wherein the clock controller is configured to provide second marks and Greenwich Mean Time.

5. The circuit of claim 1, further includes a clock tree coupled to the clock controller and configured to generate substantially same clock signals for a plurality of components.

6. The circuit of claim 5, wherein the plurality of components is one of a set of cells, a set of units, a set of nodes, and a set of boards.

7. The circuit of claim 5, wherein the plurality of components is a set of cells organized in a hypercube configuration capable of routing network traffic.

8. The circuit of claim 1, wherein the DAC signals are generated in response to the GPS signals.

9. The circuit of claim 8, wherein the atomic clock adjusts clock signals based on the DAC signals.

10. A clock distributor, comprising:
a first clock component able to receive global positioning system ("GPS") clock signals from a satellite and configured to generate first clock signals in accordance with the GPS clock signals;
a second clock component coupled to the first clock component and configure to provide second clock signals in response to the first clock signals;
a controller coupled to the first clock component and configured to generate third clock signals in accordance with the GPS clock signals; and
a clock tree coupled to the controller and configured to generate a plurality set of substantially same clock signals in response to the second and third clock signals,
wherein the controller includes a digital analog counter ("DAC") for generating DAC signals which are forwarded to the second clock component for adjusting the second clock signals, wherein the controller receives signals from the first clock component and the second clock component, and outputs second mark ("SM") clock signals and Greenwich Mean Time ("GMT") signals to the clock tree, wherein each set of the plurality sets of substantially same clock signals includes SM signals, GMT signals, and 10 MHz (megahertz) clock signals.

11. The clock distributor of claim 10, further comprising a plurality of cells coupled to the clock tree and configured to route data traffics in accordance with at least a portion of the plurality sets of substantially same clock signals, wherein the plurality of cells contains programmable logic devices.

12. The clock distributor of claim 11, wherein the plurality of cells is organized in a hypercube configuration.

13. The clock distributor of claim 10, wherein the first clock component is a GPS clock able to provide long-term accurate clock signals to the controller.

14. The clock distributor of claim 13, wherein the second clock component is an atomic clock able to provide short-term accurate clock signals to the controller.

15. A method of clock management, comprising:
receiving global positioning system ("GPS") clock signals from a satellite for providing long-term accurate clock signals;
generating short-term accurate clock signal with adjustment based on the long-term accurate clock signals;
producing Greenwich Mean Time ("GMT") signals in accordance with the long-term accurate clock signals;
creating a plurality sets of substantially same clock signals in response to the short-term accurate clock signals and the GMT signals; and
forwarding the plurality sets of substantially same clock signals to a plurality of cells for data traffic routing.

16. The method of claim 15, wherein producing the GMT signals includes generating second mark ("SM") clock signals in accordance with the long-term accurate clock signals.

17. The method of claim 16, wherein creating a plurality sets of substantially same clock signals includes generating each of the plurality sets of substantially same clock signals containing ten (10) Megahertz clock signals, SM clock signals, and GMT signals.

* * * * *